United States Patent [19]
Penunuri et al.

[11] Patent Number: 5,638,036
[45] Date of Patent: Jun. 10, 1997

[54] ACOUSTIC WAVE LADDER FILTER WITH UNEQUAL SERIES AND SHUNT TRANSDUCER PERIODICITIES AND METHOD OF MAKING

[75] Inventors: David Penunuri, Fountain Hills; Thomas S. Hickernell, Mesa, both of Ariz.

[73] Assignee: Motorola, Inc., Schaumburg, Ill.

[21] Appl. No.: 526,340

[22] Filed: Sep. 11, 1995

[51] Int. Cl.⁶ .................................................. H03H 9/64
[52] U.S. Cl. ...................... 333/194; 333/195; 310/313 B; 310/313 D; 29/25.35
[58] Field of Search ............................ 333/193, 194, 333/195, 196, 150–154; 310/313 R, 313 B, 313 C, 313 D; 29/25.35

[56] References Cited

U.S. PATENT DOCUMENTS

| | | | |
|---|---|---|---|
| 5,471,178 | 11/1995 | Hickernell | 333/193 |
| 5,559,481 | 9/1996 | Satoh et al. | 333/143 |

FOREIGN PATENT DOCUMENTS

| | | | |
|---|---|---|---|
| 6188673 | 8/1994 | Japan. | |
| 6260876 | 9/1994 | Japan | 333/193 |
| 9502160 | 8/1995 | United Kingdom. | |

*Primary Examiner*—Benny Lee
*Assistant Examiner*—Barbara Summons
*Attorney, Agent, or Firm*—Frederick M. Fliegel

[57] ABSTRACT

A method and apparatus for a ladder filter (300, 400) incorporating same. The filter (100) includes a substrate and a first series resonator (100, 305, 403) disposed on the substrate and electrically coupled in series between the first electrical port (301, 401) and a first node. The first series resonator (100, 305, 403) includes a first series acoustic reflector (303), a first series gap (112), a first series transducer (105, 304, 403), a second series gap (112) and a second series acoustic reflector (115', 306) collectively disposed in an in-line configuration along a principal axis of the substrate. The filter (300, 400) also includes a first shunt resonator (100', 310, 404) disposed on the substrate and electrically coupled in shunt between the first node and ground. The first shunt transducer (105', 312, 404) and the first series transducer (105, 304, 403) have different periodicities not equal to periodicities of the first and second series acoustic reflectors (303, 306) and the first and second shunt acoustic reflectors (311, 313).

23 Claims, 5 Drawing Sheets

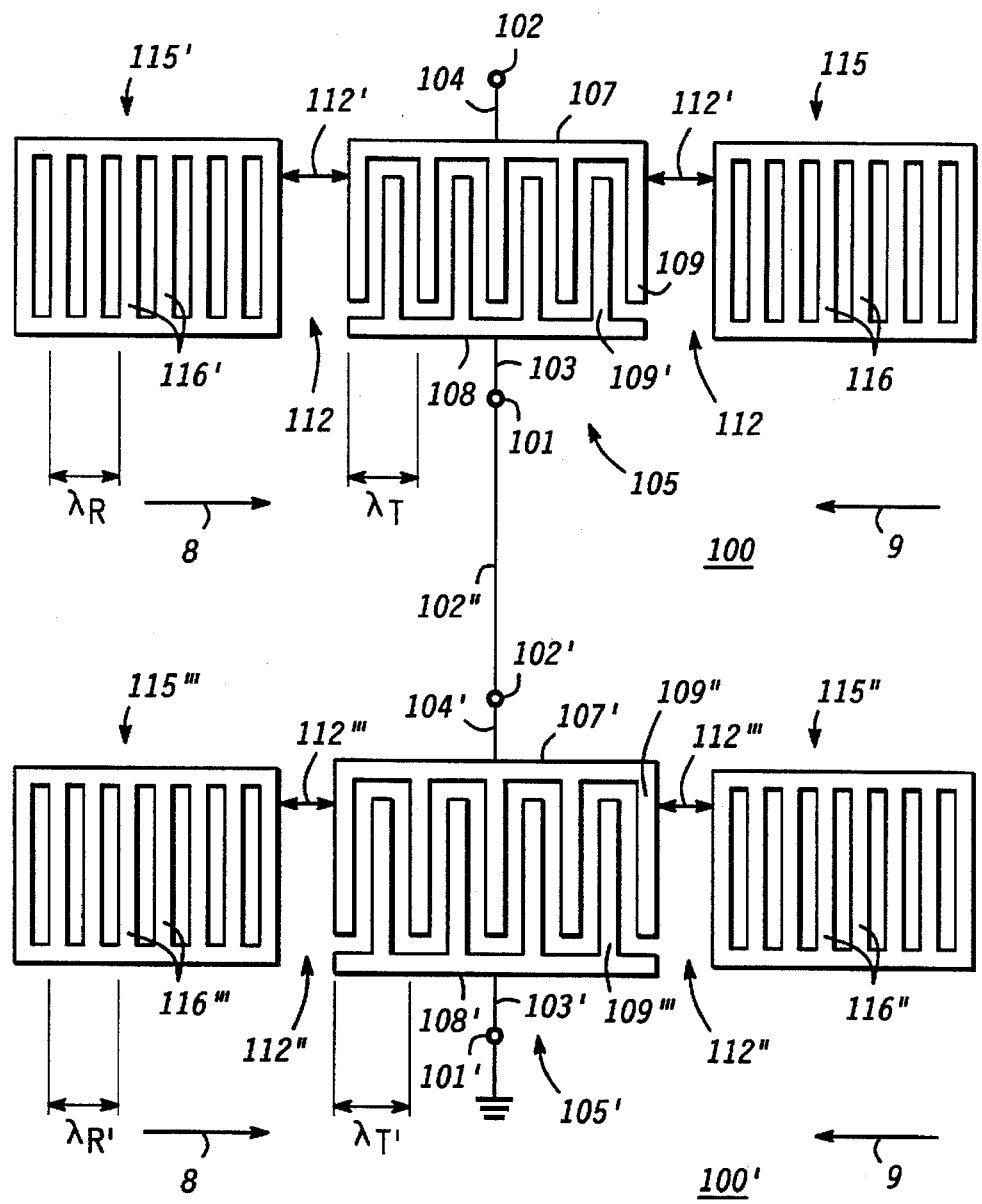
FIG. 1
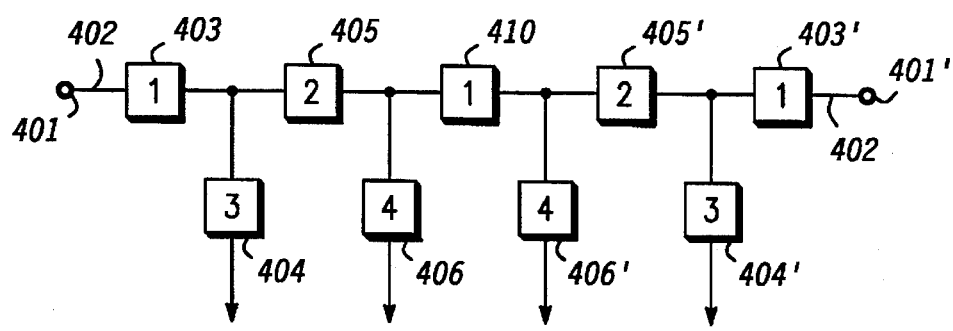
FIG. 4       400

ACOUSTIC WAVE LADDER FILTER WITH UNEQUAL SERIES AND SHUNT TRANSDUCER PERIODICITIES AND METHOD OF MAKING

FIELD OF THE INVENTION

The present invention relates in general to surface acoustic wave filters, in particular to leaky surface wave/surface skimming bulk wave filters and more particularly to acoustic filters fabricated with high electromechanical coupling coefficient substrates.

BACKGROUND OF THE INVENTION

There is an ongoing need for component miniaturization in radio wave communication devices. For example, smaller and more efficient components are needed for light-weight, hand-portable cellular telephones, wireless local area networks for linking computer systems within office buildings in a readily reconfigurable fashion, wristwatch- and credit-card-sized paging apparatus and other devices for promoting rapid, efficient and flexible voice and data communication.

Filters are needed for a variety of such communications applications wherein small size, light weight and high performance are simultaneously required. Increasing numbers of products seek to employ fixed spectral resources, often to achieve tasks not previously envisioned. Examples include cellular telephones, inter- and intra-facility computer-computer and/or computer-ancillary equipment linkages as well as a host of other, increasingly complex inter-personal and/or -equipment information sharing requirements. The desire to render increasingly complicated communications nodes portable and even hand-held and/or -portable and/or pocket-sized places extreme demands on filtering technology in the context of increasingly crowded radio frequency resources.

Acoustic wave filters provide filters meeting stringent performance requirements which are (i) extremely robust, (ii) readily mass produced, (iii) adjustment-free over the life of the unit and which (iv) sharply increase the performance-to-size ratio achievable in the frequency range extending from a few tens of megahertz to about several gigahertz. However, need for low passband insertion loss simultaneously coupled with demand for high shape factor and high stopband attenuation pose filter design and performance requirements not easily met by a single acoustic wave filter alone.

One approach to satisfying these needs and demands is to cascade two or more acoustic wave filters. This approach realizes increased stopband signal rejection but requires additional matching components (e.g., inductors and/or capacitors) and also multiplies the volume and weight of the acoustic wave filters by the number of such filters cascaded when each filter is separately realized, impedance matched and packaged. Matching components additionally incur major size and weight penalties because each transducer generally requires at least two matching components, each of which is at least as large as an acoustic wave filter die.

Another approach is to provide two or more such filters on a single substrate, wherein the filters are designed to have purely real impedances matched one to another without requiring intervening matching components. One realization includes a series-parallel arrangement of resonant elements having staggered center frequencies and arranged in a ladder structure, i.e., a structure comprising cascaded sections each including a series resonant element followed by a shunt resonant element. Typically, within each section, the anti-resonant frequency of the shunt element is chosen to be equal to the resonant frequency of the accompanying series element. Disadvantages of this approach when implemented employing SAW resonators include a fixed bandwidth for the electromechanical coupling coefficient ($k^2$) associated with the chosen substrate material. Generally, conventional design approaches are such that when three of the filter material, impedance, selectivity and bandwidth characteristics are specified, the fourth is also determined.

Acoustic wave filters including ladder filters formed from groupings of resonators employ generally periodic arrays of electrodes configured to provide discrete elements such as transducers (for converting electrical to mechanical energy and vice versa), reflectors (for reversing the direction of propagation of an acoustic wave) and gaps for separating transducers and reflectors. These elements are grouped in a generally in-line configuration (e.g., reflector, gap, transducer, gap, reflector) along a principal axis of acoustic wave propagation on a suitable substrate material, with the entire array providing an electrical filtering function associated with the electrical port(s) of the individual transducer (s) and/or the composite filter.

What is needed is a ladder filter configuration/design methodology providing flexible bandwidth, suitable out-of-band rejection and low in-band insertion loss, drift-free performance and realizable in compact, robust and desirably in monolithic form.

What is needed is an apparatus comprising acoustic wave filters and especially ladder filters having electrical performance characteristics that are less degraded by the quality factors of the individual resonators comprising the filter, even when implemented on high coupling coefficient substrates, and a method for making same.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

FIG. 1 is a plan view of an acoustic wave resonator in accordance with the present invention;

FIG. 4 is a block diagram of a ladder filter in accordance with an exemplary embodiment of the instant invention;

Figure 2:
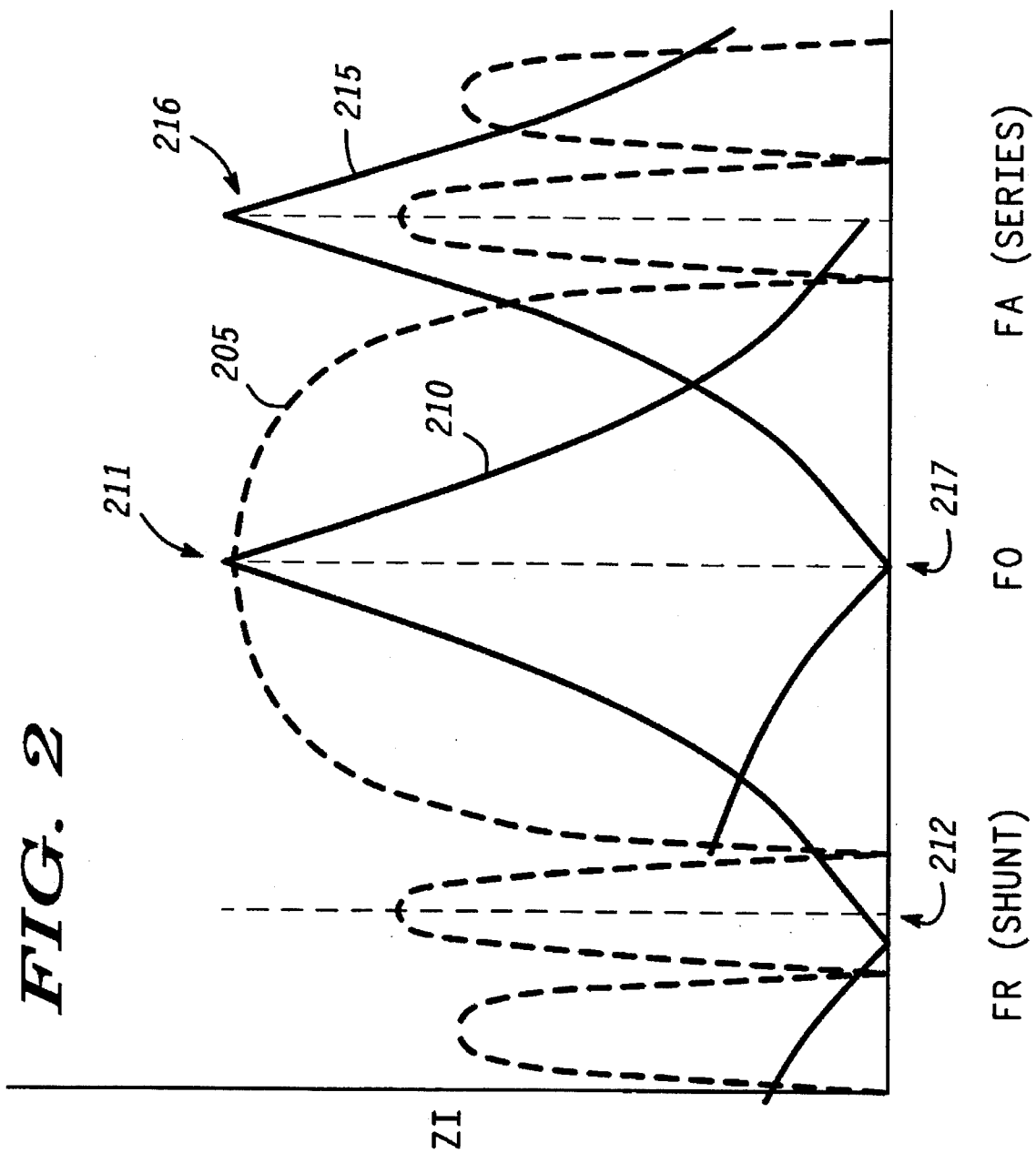
FIG. 2 is a graph of frequency responses for the elements of the resonator of FIG. 1.

The exemplification set out herein illustrates a preferred embodiment of the invention in one form thereof, and such exemplification is not intended to be construed as limiting in any manner.

DETAILED DESCRIPTION OF THE DRAWINGS

Generally, the present invention provides a method and apparatus for improving quality factor of series and shunt elements and related effects in acoustic wave (e.g., SAW, surface skimming bulk wave, leaky wave etc.) ladder-type filters fabricated on high electrical coupling coefficient substrates. The present invention may be more fully understood with reference to FIG. 1, which provides a simplified plan view of series acoustic wave resonator 100 and shunt acoustic wave resonator 100' in accordance with the present invention. FIG. 1 illustrates acoustic wave resonator 100 comprising reflectors 115, 115', one or more transducers 105 separated from reflectors 115, 115' by gaps 112, all collectively disposed in an in-line configuration along a preferred axis of the substrate material and on a suitably-prepared surface thereof. FIG. 1 also provides a simplified plan view of shunt acoustic wave resonator 100' in accordance with the present invention. FIG. 1 illustrates acoustic wave resonator 100' comprising reflectors 115", 115''', one or more transducers 105' separated from reflectors 115", 115''' by gaps 112", all collectively disposed in an in-line configuration along a preferred axis of the substrate material and on a suitably-prepared surface thereof.

Electrical stimulation at an appropriate frequency supplied from electrical ports 101, 102 to bus bars 107, 108 via interconnections 103, 104 and thence to interdigitated or interleaved electrodes 109, 109' results in acoustic waves being generated within transducer 105 of series resonator 100 and similarly with respect to electrical ports 101', 102', bus bars 108', 108', interconnections 103', 104', interdigitated electrodes 109", 109''' and transducer 105' of shunt resonator 100', one side (port 101') of which is coupled to ground and the other side (port 102') of which is coupled to port 101 of series resonator 100 and also to any further series resonator or output (not shown in FIG. 1) via port 102". Similarly, acoustic waves of an appropriate frequency impinging upon electrodes 109, 109''' result in electrical signals being manifested at interconnections 101, 102. As used herein, the term "acoustic wavelength" is taken to mean an acoustic wavelength at the filter center frequency, i.e., in the nominal center of the filter passband.

Each transducer 105, 105' comprises a series of periodically disposed electrodes 109", 109', 109, 109''' often one-fourth of an acoustic wavelength in width, disposed on one-half acoustic wavelength centers, usually alternately coupled to their associated bus bars 107, 108, 107', 108' respectively, although other arrangements are possible and useful.

Gaps 112, 112" have gap breadth 112', 112''' chosen in accordance with design principles applicable to acoustic wave filters and the specifications applicable to the filter being designed. Gap breadths 112',112''' influence passband characteristics such as bandwidth and passband ripple. Reflectors 115, 115' have a characteristic periodicity and therefore a characteristic wavelength $\lambda_R$ while transducer 105 also has a characteristic periodicity and therefore a characteristic wavelength $\lambda_T$. Similarly, reflectors 115", 115''' have a characteristic periodicity and therefore a characteristic wavelength $\lambda_R'$ while transducer 105' also has a characteristic periodicity and therefore a characteristic wavelength $\lambda_T'$. Hereinafter, in order to simplify discussion and as an aid to the reader, discussion will be in terms of series resonator 100 and component parts thereof with the understanding that, with the exception of characteristic wavelengths, shunt resonator 100' has many characteristics in common with series resonator 100. Typically, both transducer 105 and reflectors 115, 115' comprises electrodes or fingers 109, 109' or 116, 116' one-fourth of a wavelength broad (as illustrated), providing two of electrodes 109, 109' or 116/116' and two intervening gaps per wavelength, however, it will be appreciated that other arrangements are possible and in some applications are preferred.

Resonator 100 may be constructed on suitably-prepared substrates such as 41° rotated, Y-cut, X-propagating $LiNbO_3$, 64° rotated, Y-cut, X-propagating $LiNbO_3$ and 36° rotated, Y-cut, X-propagating $LiTaO_3$. Resonator 100 is typically fabricated by depositing and patterning a thin metal film, often comprising aluminum, in a thickness ranging from tens to hundreds of nanometers thick, by techniques similar to those employed in integrated circuit manufacturing.

The present invention is especially useful when low insertion loss is required together with wide passband width, for which higher electromechanical coupling coefficient substrates are particularly well suited. Typically, the designer of such a filter chooses gap widths (e.g., 112') for gaps (e.g., 112) disposed between the transducer (e.g., 105) and the reflectors (e.g., 115, 115') to provide an approximation to a combination of passband insertion loss, out-of-band rejection characteristics and bandwidth and then adjusts widths 112' of gap(s) 112 disposed between transducer 105 and reflectors 115, 115' to realize optimum bandwidth, insertion loss and other filter characteristics.

Resonator 100 of FIG. 1 is conveniently modeled as a series RLC circuit (e.g., a resistor of resistance R having one lead coupled to terminal 101 of FIG. 1, in series with an inductor having inductance L, in turn coupled in series with a capacitor having capacitance $C_m$ and having a second lead coupled to terminal 102) bridged by a capacitor having capacitance $C_o$ (i.e., coupled from terminal 101 to terminal 102). Values for components $C_o$, $C_m$, L, R are found from Eqs. 1-3 (infra), the geometry of transducer 105 and relevant material constants. R may be usefully estimated as zero (i.e., ignored) or may be modeled from empirical data. Values of a few Ohms are often encountered in practice. R represents bulk wave radiation, acoustic propagation away from the receiving transducer, metal resistivity, diffraction effects and other losses encountered in acoustic resonant elements. Static capacitance $C_o$ is found from:

$$C_o = C_e N W, \qquad (1)$$

where $C_e$ is a material parameter describing capacitance per finger pair per cm (tabulated for many materials in a variety of textbooks), N represents the number of transducer finger pairs (e.g., pairs of electrodes 109, 109' in transducer 105, FIG. 1) and W represents the overlap of electrodes 109, 109' or beamwidth in cm.

Motional capacitance $C_m$ is related to static capacitance $C_o$:

$$C_m = (8k^2 C_o)/(\pi^2), \qquad (2)$$

where $k^2$ represents the electromechanical coupling coefficient (tabulated in a variety of textbooks related to piezoelectric materials). Motional inductance L is given by:

$$L = 1/(C_m \omega_r^2), \qquad (3)$$

where $\omega_r$ represents the radian transducer resonant frequency.

Admittance Y measured between terminals 101, 102 of FIG. 1 is:

$$Y = j\omega C_o + 1/(R + j(\omega L - 1/(\omega C_m))). \qquad (4)$$

Admittance Y has resonant frequency $\omega_r$, usually close to and slightly lower than the acoustic center frequency (approximately the sound velocity divided by the acoustic wavelength associated with the periodicity of electrodes 109, 109' of transducer 105):

$$\omega_r = (LC_m)^{-0.5}, \quad (5)$$

and antiresonant frequency $\omega_a$:

$$\omega_a = \omega_r(1 + C_m/C_o)^{0.5}, \quad (6)$$

or $$\omega_a = \omega_r(1 + 8k^2/\pi^2)^{0.5}. \quad (7)$$

For a given transducer 105, antiresonant frequency $\omega_a$ is always greater than resonant frequency $\omega_r$ by a ratio determined by electromechanical coupling coefficient $k^2$ (Eq. 7). For extremely high coupling coefficients (e.g., $k^2 > 5\%$), an appropriate coupling coefficient value may need to be empirically determined because the assumptions employed in relating physical parameters (e.g., acoustic wavelength, radiation conductance, $\omega_a$, $\omega_r$ etc.) to each other and to acoustic center frequencies are not entirely valid. In accordance with the present invention, coupling coefficients are generally usefully greater than 0.0001, more usefully greater than 0.01, generally desirably greater than 0.05, more desirably greater than 0.07 and preferably greater than 0.10.

Prior art ladder filters typically employ elements wherein the resonant frequency of the series elements are chosen to be equal to the antiresonant frequencies of the shunt elements. In traditional narrow-band crystal lattice filters employing quartz resonant elements, electromechanical coupling coefficient $k^2$ is typically much smaller than 0.5%, limiting the fractional bandwidth (bandwidth divided by center frequency) achievable for such filters to very small values.

Applicants have discovered that use of much higher coupling coefficient materials (e.g., $LiNbO_3$, $LiTaO_3$ etc.) provide much greater spread between resonant and antiresonant frequencies. For example, 64° $LiNbO_3$ provides a coupling coefficient in the range of from 9% to 13% (nominally about 10.5%), 41° $LiNbO_3$ provides coupling coefficients in the range from 15-25% (nominally about 17%) and 36° $LiTaO_3$ provides coupling coefficients in the range from 6.5-8% (nominally about 7.5%). This increased frequency spread in turn allows greater design freedom.

Applicants have also discovered that choosing resonant frequency $\omega_r$ of the shunt resonant element to be less than the nominal frequency $\omega_R$ of reflectors 115, 115' and also that choosing the nominal frequency $\omega_R$ of reflectors 115, 115' to be less than the antiresonant frequency $\omega_a$ of the series resonant element provides design flexibility and allows the reflector wavelength $\lambda_R$ to be chosen to be similar or identical for both the series and the shunt resonator elements in a ladder filter structure.

EXAMPLE I

For example, Table I below compares one design having a nominal center frequency of about 860 MHz and employing five series and five shunt resonators fabricated on 36° $LiTaO_3$ (labeled "Second") to another filter not including reflectors in the resonator structures (labeled "First").

The first resonator filter described in Table I had a 3 dB passband bandwidth of 11.5 MHz and a minimum insertion loss of 7.5 dB. The poor passband insertion loss is directly attributable to the poor Q given in Table I for the example marked "first" and results from lack of any reflectors 115/115'. The second resonator filter described in Table I includes reflectors 115, 115' and had a 3 dB passband bandwidth of about 12.5 MHz and an insertion loss of about 5 dB. In these experiments, the passband insertion loss improved by about 2.5 dB.

TABLE I

|  | $\lambda_R, \lambda_T$ (microns) | $N_T$ | Gap | $Q_a$ | $f_a$ | $Q_r$ | $f_r$ |
|---|---|---|---|---|---|---|---|
| First series | N/A, 4.65 | 101 | N/A |  |  | 365 | 862 |
| shunt | N/A, 4.80 | 101 | N/A | 3.5 | 890 |  |  |
| Second series | 4.76, 4.65 | 101 | 0.625 |  |  | 380 | 862 |
| shunt | 4.77, 4.80 | 101 | 0.625 | 620 | 890 |  |  | transducer parameters for two ladder filters, where the subscripts R and T refer to reflector and transducer and $\lambda$ and N refer to the periodicity and number of elements, respectively.

When the reflectors for the series transducers were fashioned with a increased period/wavelength (decreased effective frequency) and the reflectors of the shunt transducers were fabricated with an decreased period/wavelength (increased effective frequency), the bandwidth increased to 21.9 MHz and the minimum insertion loss decreased to about 2 dB, a 3 dB improvement. It will be appreciated that, because the antiresonant frequency of the shunt transducer is close to the resonant frequency of the series transducer, the same reflector periodicity may desirably be chosen for both the series and shunt transducers in some cases, and that this in turn may allow a given reflector to be a portion of more than one resonator without compromising performance of either resonator.

EXAMPLE II

FIG. 2 is a graph of frequency responses for the elements of resonator 100 (FIG. 1). Trace 215 has associated antiresonance 216, corresponding to a high impedance measured between terminals 101, 102 (FIG. 1) and associated resonance 217, corresponding to a low impedance measured between terminals 101, 102 (FIG. 1). Similarly, trace 210 has associated antiresonance 211, corresponding to a high impedance measured between terminals 101, 102 (FIG. 1) and associated resonance 212, corresponding to a low impedance measured between terminals 101, 102 (FIG. 1). Trace 205 corresponds to a frequency dependence of reflectivity for reflector 115 or 115' (FIG. 1). Placement of resonance and antiresonance frequencies within the broad central peak of trace 205 illustrated in FIG. 2 optimizes Q for resonance 217 and for antiresonance 211 by including both well within optimal reflectivities shown in trace 205. Applicants have discovered that this may be effected by choosing the reflector periodicity $\lambda_R$ appropriately.

Figure 3:
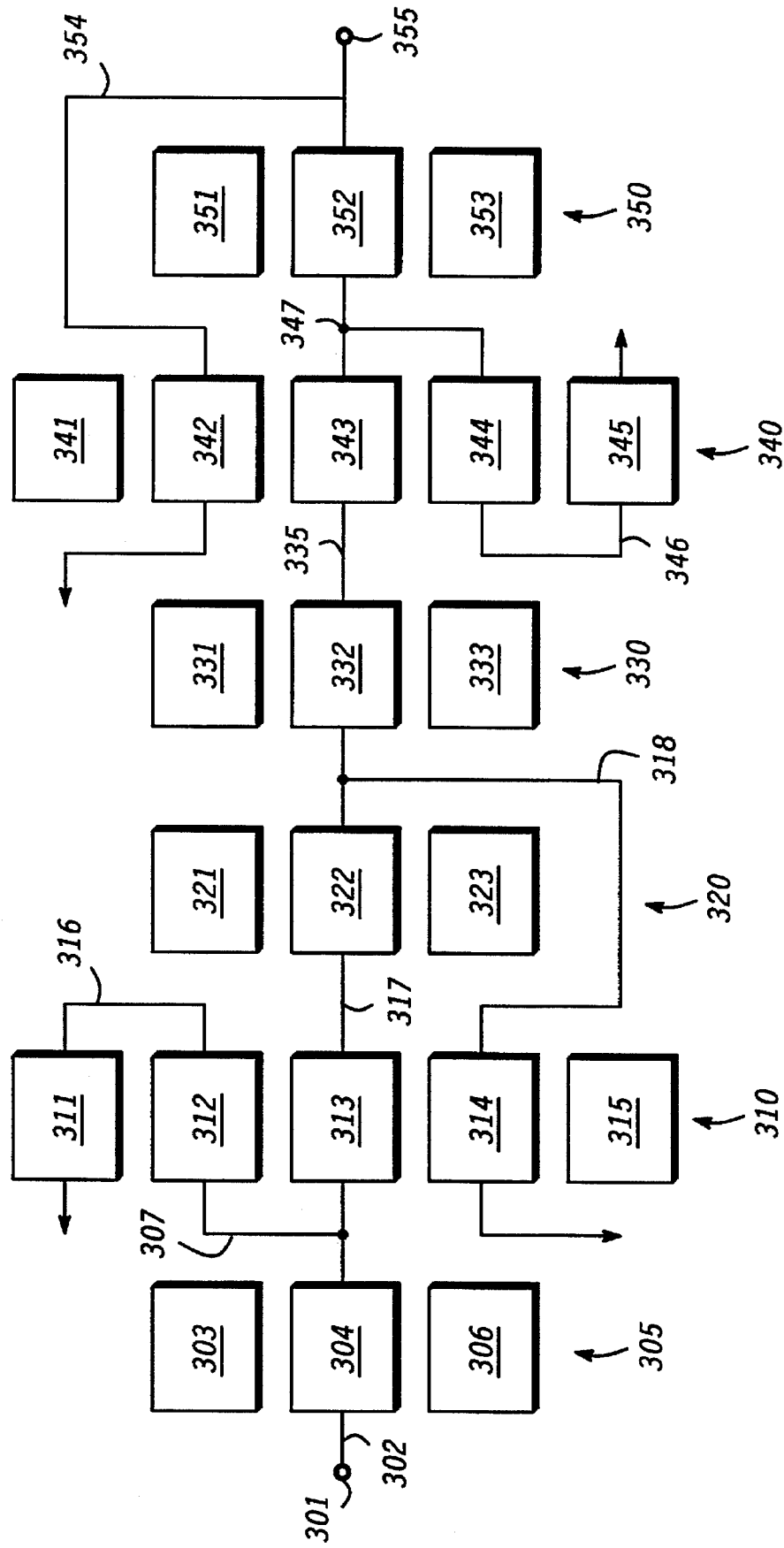
FIG. 3 is a simplified plan view of a four section ladder filter in accordance with the present invention.

FIG. 3 is a simplified plan view of four section ladder filter 300 in accordance with the present invention and generally comprising resonators 305, 310, 320, 330, 340, 350. Filter 300 comprises electrical ports 301, 355 electrically coupled by interconnections 302, 354 to series transducers 304, 352, respectively. Series transducer 304 has associated acoustic reflectors 303, 306 disposed to either side thereof along a principal axis of acoustic wave propagation, forming an in-line configuration and comprising resonator structure 305.

Interconnections 307, 317 electrically couple series transducer 304 to series transducer 322 via reflector 313 of resonator 310, with reflector 313 functioning as an electrical conductor vis-a-vis series transducers 304, 322.

Resonator 305 comprises series transducer 304 and associated reflectors 303, 306 disposed to either side thereof along a principal axis of acoustic wave propagation, forming an in-line configuration. Resonator 305 is electrically coupled to electrical port 301 via interconnection 302 and to resonators 310, 320.

Resonator 310 comprises shunt transducer 312 electrically coupled via interconnection 307 from a node associated with both of series transducers 304, 322 to ground and also includes associated reflectors 311, 313. Resonator 310 also comprises shunt transducer 314 electrically coupled via interconnection 318 from a node associated with both of series transducers 322, 332 to ground and also includes associated reflectors 313, 315. Reflector 313 thus functions as an electrical interconnection and as a reflector for two separate and distinct resonant cavities. Shunt transducers 312, 314 share reflector 313 but are generally acoustically decoupled from each other, providing savings in area (by achieving plural functions via a single reflector) and also providing electrical and acoustic isolation between filter stages. Resonator 310 thus comprises a series of reflectors and transducers disposed in an in-line configuration along a principal axis of the substrate.

Resonator 320 includes series transducer 322 and associated reflectors 321, 323 disposed to either side thereof along a principal axis of acoustic wave propagation, forming an in-line configuration. Resonator 330 comprises transducer 332, reflectors 331, 333 and is electrically coupled from series transducer 322 (via interconnection 318) to series transducer 352 via reflector 343 of resonator 340 and interconnections 335, 347.

Resonator 340 comprises shunt transducer 342 electrically coupled to a node associated with series transducer 352 via interconnection 354 and transducer 342 is also coupled to ground. Resonator 340 includes reflectors 341, 343 associated with shunt transducer 342. Resonator 340 also includes reflectors 343, 345 associated with shunt transducer 344. Shunt transducer 344 is electrically coupled from a node associated with both of series transducers 332, 352 via interconnection 347 and is also electrically coupled to ground. Reflector 343 thus functions as an electrical interconnection and as a reflector for two separate and distinct resonant cavities. Shunt transducers 342, 344 share reflector 343 but are generally acoustically decoupled from each other, providing savings in area (by achieving plural functions via a single reflector) and also providing electrical and acoustic isolation between filter stages. It will be appreciated that interconnection 318 could be realized via reflector 323 (much as reflectors 313, 343 serve as interconnections). Resonator 340 thus comprises a series of reflectors and transducers disposed in an in-line configuration along a principal axis of the substrate.

Resonator 350 comprises series transducer 352 and associated reflectors 351, 353 disposed to either side thereof along a principal axis of acoustic wave propagation, forming an in-line configuration. Resonator 350 is electrically coupled to electrical port 355 via interconnection 354 and to resonators 330, 340.

Transducers comprising series elements 304, 322, 332, 352 and shunt elements 312, 314, 342, 344 typically have principal directions of acoustic wave propagation (analogous to directions 8, 9, FIG. 1) aligned to a common preferred axis, i.e. parallel to one another. In accordance with the present invention, series and shunt elements' resonant $\omega_r$ and antiresonant $\omega_a$ frequencies are usefully determined via circuit optimization tools such as SuperCompact®, available from Compact Software of Paterson N.J. One method is to input a series of resonant $\omega_r$ and/or antiresonant $\omega_a$ frequencies in accordance with Eq. 7, with the shunt elements' antiresonant frequencies $\omega_a$ approximately equal to the series elements' resonant frequencies $\omega_r$, and to then enable the circuit optimization tools to determine a modified set of resonant $\omega_r$ and antiresonant $\omega_a$ frequencies.

Ladder filters using surface acoustic wave resonators and especially resonators designed for relatively wide-band performance may be readily scaled in frequency by changing the pitch (periodicity) of the resonator transducer fingers (109, 109', FIG. 1) and reflector fingers (116, 116', FIG. 1) while maintaining the ratios of the resonant frequencies $\omega_r$ obtained from circuit analysis tools or other methods. This allows a designer to re-use a similar design at a slightly different center frequency $f_o$ having similar specifications or permits a quick, two iteration convergence to a desired set of filter characteristics when the relationship between the resonant frequency $\omega_r$ and the transducer acoustic center frequency is not known a priori (e.g., on very high coupling coefficient materials where conventional approximations tend to provide poorer design guidance).

EXAMPLE III

FIG. 4 is a block diagram of ladder filter 400 in accordance with an exemplary embodiment of the instant invention. Ladder filter 400 includes electrical ports 401, 401' each coupled to transducer 403, 403', respectively, via interconnections 402, 402', respectively. Transducers 403, 403' each couple to shunt transducers 404, 404', respectively, and also each couple to series transducers 405, 405', respectively. Series transducers 405, 405' each couple to shunt transducers 406, 406', respectively, and also each couple to series transducer 410, coupling the two halves of filter 400 together.

Series transducers 403, 403', 405, 405', 410 each included 201 electrodes and had beamwidths of 39.9 micrometers while shunt transducers 404, 404', 406, 406' each included 301 electrodes and had beamwidths of 61.2 micrometers. All of the transducers were associated with gratings having a pitch of 2.6 micrometers, corresponding to a nominal frequency of 860 MHz and a center-frequency wavelength of 5.21 micrometers. Other characteristics of the transducers comprising the experimental filter are summarized below in Table II.

A nine resonator filter analogous to that depicted in FIG. 4 in block form was constructed on 64° LiNbO$_3$ and measured results from this filter are provided below in FIG. 5 and discussed in associated text.

TABLE II

| T | $\lambda_T$ (microns) | $\lambda_R$ (microns) | $f_r$ (MHz) | $f_a$ (MHz) | Gap ($\lambda_R$) |
| --- | --- | --- | --- | --- | --- |
| 403 | 5.09 | 5.21 | 858.4 | 897.8 | 5/8 |
| 404 | 4.97 | 5.21 | 878.0 | 918.3 | 5/8 |
| 405 | 5.28 | 5.21 | 826.0 | 864.0 | 11/16 |
| 406 | 5.29 | 5.21 | 824.8 | 862.7 | 11/16 | transducer parameters for the ladder filter of FIG. 4, where the subscripts R and T refer to reflector and transducer, λ refers to periodicity and r and a refer to resonant and antiresonant, respectively.

Figure 5:
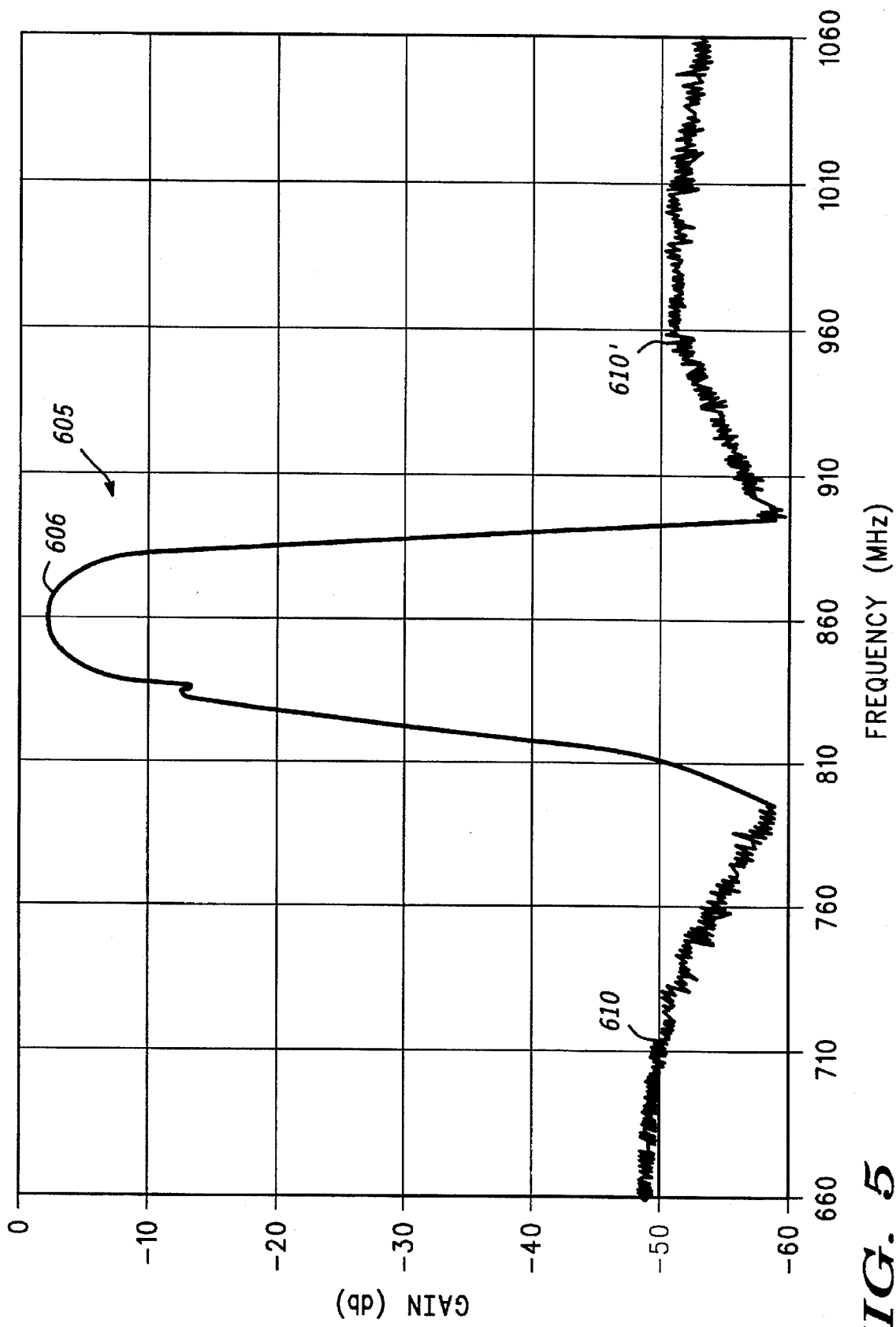
FIG. 5 provides a graphical depiction of a measured frequency responses for the ladder filter of FIG. 4 in accordance with the present invention.

FIG. 5 provides a graphical depiction of a measured frequency responses for the ladder filter of FIG. 4 in accordance with the present invention. Trace 605 includes passband region 606 showing a minimum insertion loss of about 2 dB, an out-of-band rejection region 610 illustrating 48 dB or more rejection from 660 to greater than 810 MHz and an out-of-band rejection region 610' having more than 50 dB of rejection from about 890 MHz to greater than 1060 MHz. In the lower frequency portion of region 610, rejection exceeds 50 dB from about 720 MHz to slightly greater than 810 MHz. The out-of-band signal rejection achieved is limited by several factors including the ratio of the static capacitances of the series and shunt transducers, which form a simple voltage divider network at frequencies well removed from the passband.

Figure 6:
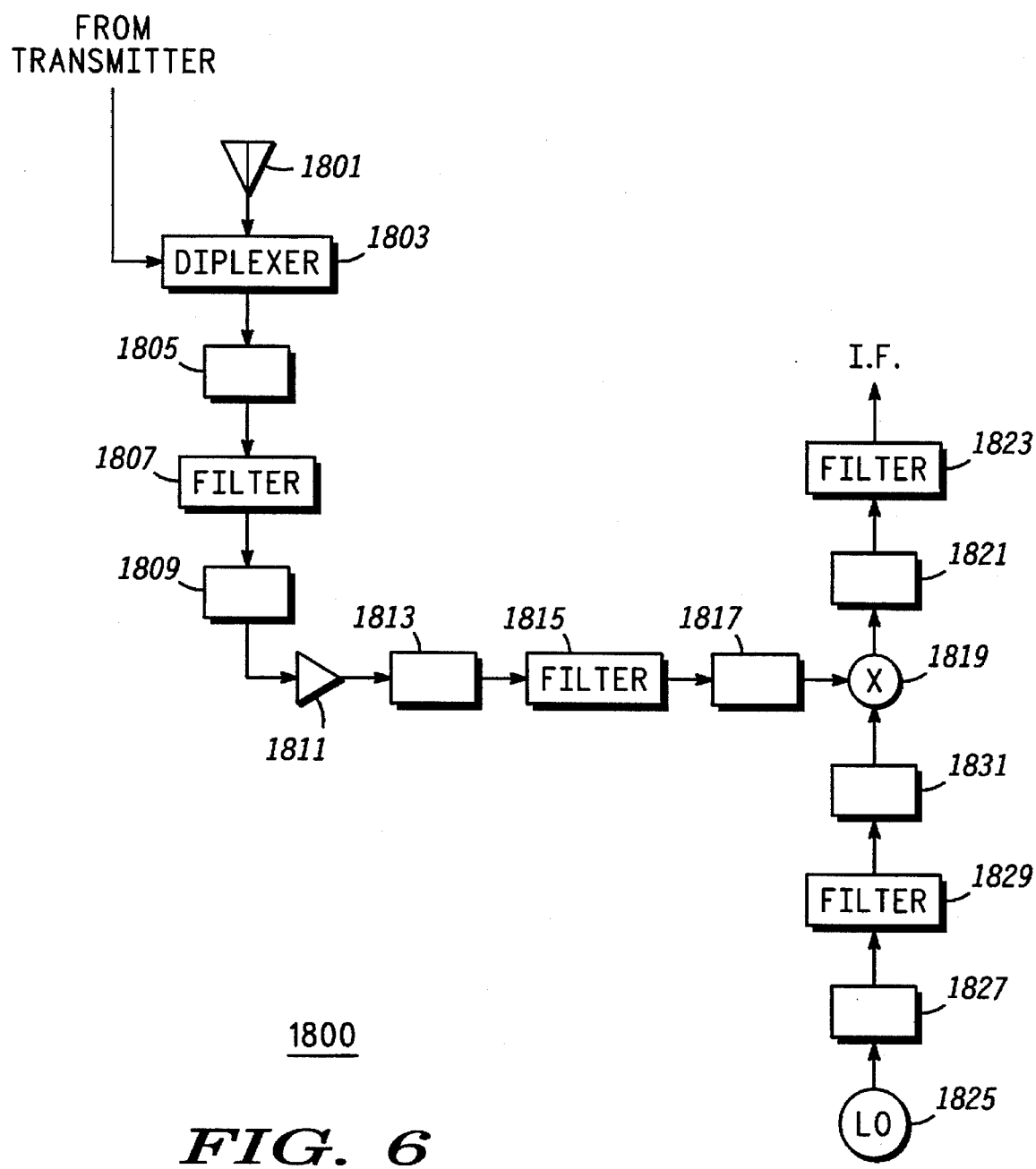
FIG. 6 is a block diagram of a portion of a radio frequency apparatus including ladder filters in accordance with the present invention.

FIG. 6 is a block diagram of portion 1800 of a radio frequency receiver or other radio frequency apparatus including ladder filters in accordance with the present invention. Apparatus 1800 includes antenna 1801, by way of example, used to receive and/or transmit signals. Alternatively, antenna 1801 could be replaced by a fiber-optic link or cable or other signal transmissive media.

Diplexer 1803 is coupled to antenna 1801 and to a transmitter portion (not shown). Diplexer 1803 is a special purpose filter which couples received signals (but not much larger signals from an attached transmitter) to filter 1807 via optional matching circuit 1805 according to the present invention. Filter 1807 is coupled to amplifier 1811 via optional matching element 1809 according to the present invention. The output of amplifier 1811 is transmitted to filter 1815 via optional matching element 1813 according to the present invention. Filter 1815 transmits its output to mixer 1819 via optional matching element 1817 according to the present invention. The signal from filter 1815 is combined in mixer 1819 with another signal from local oscillator 1825 coupled via filter 1829. Matching elements 1827, 1831 and 1821 are optionally provided with filters 1823, 1829. The output signal from mixer 1819 is then filtered by filter 1823 to provide the IF output signal. The arrangement of the present invention may be used to provide any or all of filters 1803, 1807, 1815, 1823, 1829. An oscillator and filter analogous to LO 1825, filter 1829 may be employed together with a suitable amplifier and modulator to provide the signal "FROM TRANSMITTER" and this filter (known as a "transmit clean-up filter") as well may be provided in accordance with the present invention. Thus, a ladder filter has been described which overcomes specific problems and accomplishes certain advantages relative to prior art methods and mechanisms. The improvements over known technology are significant. The expense, complexities, and high parts count of prior art cascaded filters are avoided. Further, real input and output impedances are realized for compact, lightweight, adjustment-free filters together with improved design flexibility.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An acoustic wave filter having first and second electrical ports, said acoustic wave filter comprising:
   a) a substrate for acoustic wave propagation;
   b) a first series resonator disposed on said substrate and electrically coupled in series between said first electrical port and a first node, said first node coupled to said second electrical port, said first series resonator including:
      i) a first series acoustic reflector,
      ii) a first series gap,
      iii) a first series transducer,
      iv) a second series gap and
      v) a second series acoustic reflector collectively disposed in an in-line configuration along a preferred axis of said substrate;
   c) a first shunt resonator disposed on said substrate and electrically coupled in shunt between said first node and ground, said first shunt resonator including:
      i) a first shunt acoustic reflector,
      ii) a first shunt gap,
      iii) a first shunt transducer,
      iv) a second shunt gap and
      v) a second shunt acoustic reflector collectively disposed in an in-line configuration along a preferred axis of said substrate, wherein said first shunt transducer and said first series transducer have different periodicities not equal to periodicities of said first and second series acoustic reflectors and said first and second shunt acoustic reflectors;
   d) a second series resonator disposed on said substrate and electrically coupled in series between said first node and a second node, said second node coupled to said second electrical port, said second series resonator including:
      i) a third series acoustic reflector,
      ii) a third series gap,
      iii) a second series transducer,
      iv) a fourth series gap and
      v) a fourth series acoustic reflector collectively disposed in an in-line configuration along a preferred axis of said substrate; and
   e) a second shunt resonator disposed on said substrate and electrically coupled in shunt between said second node and ground, said second shunt resonator including:
      i) said second shunt acoustic reflector,
      ii) a third shunt gap,
      iii) a second shunt transducer,
      iv) a fourth shunt gap and
      v) a third shunt acoustic reflector collectively disposed in an in-line configuration along a preferred axis of said substrate, wherein said second shunt transducer and said second series transducer have different periodicities not equal to periodicities of said first, second, third and fourth series acoustic reflectors and said first, second and third shunt acoustic reflectors.

2. An acoustic wave filter as claimed in claim 1, wherein said first, second, third and fourth series acoustic reflectors and said first, second and third shunt acoustic reflectors have substantially identical periodicity.

3. An acoustic wave filter as claimed in claim 1, wherein said first and second shunt transducers are acoustically decoupled from each other.

4. An acoustic wave filter as claimed in claim 1, wherein a portion of an electrical interconnection between said first and second series transducers comprises said second shunt acoustic reflector.

5. An acoustic wave filter having first and second electrical ports, said acoustic wave filter comprising:
   a) a substrate for acoustic wave propagation;
   b) a first series resonator disposed on said substrate and electrically coupled in series between said first electrical port and a first node, said first node coupled to said second electrical port, said first series resonator including:
      i) a first series acoustic reflector,
      ii) a first series gap,
      iii) a first series transducer,
      iv) a second series gap and
      v) a second series acoustic reflector collectively disposed in an in-line configuration along a preferred axis of said substrate; and
   c) a first shunt resonator disposed on said substrate and electrically coupled in shunt between said first node and ground, said first shunt resonator including:
      i) a first shunt acoustic reflector,
      ii) a first shunt gap,
      iii) a first shunt transducer,
      iv) a second shunt gap and
      v) a second shunt acoustic reflector collectively disposed in an in-line configuration along a preferred axis of said substrate, wherein said first shunt transducer and said first series transducer have different periodicities not equal to periodicities of said first and second series acoustic reflectors and said first and second shunt acoustic reflectors, wherein said first and second series acoustic reflectors and said first and second shunt acoustic reflectors have substantially identical periodicity.

6. An acoustic wave filter having first and second electrical ports, said acoustic wave filter comprising:
   a) a substrate for acoustic wave propagation;
   b) a first series resonator disposed on said substrate and electrically coupled in series between said first electrical port and a first node, said first node coupled to said second electrical port, said first series resonator including:
      i) a first series acoustic reflector,
      ii) a first series gap,
      iii) a first series transducer,
      iv) a second series gap and
      v) a second series acoustic reflector collectively disposed in an in-line configuration along a preferred axis of said substrate; and
   c) a first shunt resonator disposed on said substrate and electrically coupled in shunt between said first node and ground, said first shunt resonator including:
      i) a first shunt acoustic reflector,
      ii) a first shunt gap,
      iii) a first shunt transducer,
      iv) a second shunt gap and
      v) a second shunt acoustic reflector collectively disposed in an in-line configuration along a preferred axis of said substrate, wherein said first shunt transducer and said first series transducer have different periodicities not equal to periodicities of said first and second series acoustic reflectors and said first and second shunt acoustic reflectors, wherein said first series transducer has a periodicity less than a periodicity of said first shunt transducer.

7. A method for making an acoustic wave filter having first and second electrical ports, said method comprising steps of:
   a) providing a substrate for acoustic wave propagation;
   b) disposing a first series resonator on said substrate and electrically coupled in series between said first electrical port and a first node, said first node coupled to said second electrical port, said step of disposing said first series resonator including substeps of:
      i) disposing a first series acoustic reflector,
      ii) disposing a first series gap,
      iii) disposing a first series transducer,
      iv) disposing a second series gap and
      v) disposing a second series acoustic reflector collectively in an in-line configuration along a preferred axis of said substrate; and
   c) disposing a first shunt resonator on said substrate and electrically coupled in shunt between said first node and ground, said step of disposing said first shunt resonator including substeps of:
      i) disposing a first shunt acoustic reflector,
      ii) disposing a first shunt gap,
      iii) disposing a first shunt transducer,
      iv) disposing a second shunt gap and
      v) disposing a second shunt acoustic reflector collectively in an in-line configuration along a preferred axis of said substrate, wherein said substeps of disposing said first shunt transducer and said first series transducer include substeps of disposing said first shunt transducer and said first series transducer having different periodicities not equal to periodicities of said first and second series acoustic reflectors and said first and second shunt acoustic reflectors, wherein said steps of disposing first and second shunt acoustic reflectors includes a step of disposing first and second shunt acoustic reflectors having substantially identical periodicity as said first and second series acoustic reflectors.

8. A method as claimed in claim 7, wherein said step of disposing a first shunt transducer includes a step of disposing a first shunt transducer having a periodicity greater than a periodicity of said first series transducer.

9. A method for making an acoustic wave filter having first and second electrical ports, said method comprising steps of:
   a) providing a substrate for acoustic wave propagation;
   b) disposing a first series resonator on said substrate and electrically coupled in series between said first electrical port and a first node, said first node coupled to said second electrical port, said step of disposing said first series resonator including substeps of:
      i) disposing a first series acoustic reflector,
      ii) disposing a first series gap,
      iii) disposing a first series transducer,
      iv) disposing a second series gap and
      v) disposing a second series acoustic reflector collectively in an in-line configuration along a preferred axis of said substrate;
   c) disposing a first shunt resonator on said substrate and electrically coupled in shunt between said first node and ground, said step of disposing said first shunt resonator including substeps of:
      i) disposing a first shunt acoustic reflector,
      ii) disposing a first shunt gap,
      iii) disposing a first shunt transducer,
      iv) disposing a second shunt gap and
      v) disposing a second shunt acoustic reflector collectively in an in-line configuration along a preferred axis of said substrate, wherein said substeps of disposing said first shunt transducer and said first series transducer include substeps of disposing said first shunt transducer and said first series transducer having different periodicities not equal to periodicities of said first and second series acoustic reflectors and said first and second shunt acoustic reflectors;

d) disposing a second series resonator on said substrate and electrically coupled in series between said first node and a second node, said second node coupled to said second electrical port, said step of disposing said second series resonator including substeps of:
   i) disposing a third series acoustic reflector,
   ii) disposing a third series gap,
   iii) disposing a second series transducer,
   iv) disposing a fourth series gap and
   v) disposing a fourth series acoustic reflector collectively in an in-line configuration along a preferred axis of said substrate; and e) disposing a second shunt resonator on said substrate and electrically coupled in shunt between said second node and ground, said step of disposing said second shunt resonator including substeps of:
   i) disposing said second shunt acoustic reflector,
   ii) disposing a third shunt gap,
   iii) disposing a second shunt transducer,
   iv) disposing a fourth shunt gap and
   v) disposing a third shunt acoustic reflector collectively in an in-line configuration along a preferred axis of said substrate, wherein said substeps of disposing said second shunt transducer and said second series transducer include substeps of disposing said second shunt transducer and said second series transducer having different periodicities not equal to periodicities of said first, second, third and fourth series acoustic reflectors and said first, second and third shunt acoustic reflectors.

10. A method as claimed in claim 9, wherein said steps of disposing said first and second shunt transducers includes steps of disposing first and second shunt transducers that are acoustically decoupled from each other.

11. A method as claimed in claim 9, wherein said steps of disposing first, second, third and fourth series acoustic reflectors and disposing first, second and third shunt acoustic reflectors include steps of disposing first, second, third and fourth series acoustic reflectors and first, second and third shunt acoustic reflectors having substantially identical periodicity.

12. An acoustic wave filter manufactured by the method of claim 9.

13. In a radio, an acoustic wave filter comprising:
a) a substrate for acoustic wave propagation;
b) a first series resonator disposed on said substrate and electrically coupled in series between said first electrical port and a first node, said first node coupled to said second electrical port, said first series resonator including:
   i) a first series acoustic reflector,
   ii) a first series gap,
   iii) a first series transducer,
   iv) a second series gap and
   v) a second series acoustic reflector collectively disposed in an in-line configuration along a preferred axis of said substrate, wherein said first and second series acoustic reflectors have a first periodicity different than a second periodicity of said first series transducer; and
c) a first shunt resonator disposed on said substrate and electrically coupled in shunt between said first node and ground, said first shunt resonator including:
   i) a first shunt acoustic reflector,
   ii) a first shunt gap,
   iii) a first shunt transducer,
   iv) a second shunt gap and
   v) a second shunt acoustic reflector collectively disposed in an in-line configuration along a principal preferred axis of said substrate, wherein said first shunt transducer and said first series transducer have different periodicities not equal to periodicities of said first and second series acoustic reflectors and said first and second shunt acoustic reflectors.

14. An acoustic wave filter as claimed in claim 13, further comprising:
d) a second series resonator disposed on said substrate and electrically coupled in series between said first node and a second node, said second node coupled to said second electrical port, said second series resonator including:
   i) a third series acoustic reflector,
   ii) a third series gap,
   iii) a second series transducer,
   iv) a fourth series gap and
   v) a fourth series acoustic reflector collectively disposed in an in-line configuration along a preferred axis of said substrate; and
e) a second shunt resonator disposed on said substrate and electrically coupled in shunt between said second node and ground, said second shunt resonator including:
   i) said second shunt acoustic reflector,
   ii) a third shunt gap,
   iii) a second shunt transducer,
   iv) a fourth shunt gap and
   v) a third shunt acoustic reflector collectively disposed in an in-line configuration along a preferred axis of said substrate, wherein said second shunt transducer and said second series transducer have different periodicities not equal to periodicities of said first, second, third and fourth series acoustic reflectors and said first, second and third shunt acoustic reflectors.

15. An acoustic wave filter as claimed in claim 14, wherein said first and second shunt transducers are acoustically decoupled from each other, and said first series transducer has a periodicity less than a periodicity of said first shunt transducer.

16. An acoustic wave filter as claimed in claim 14, wherein said first, second, third and fourth series acoustic reflectors and said first, second and third shunt acoustic reflectors have substantially identical periodicities.

17. An acoustic wave filter as claimed in claim 14, wherein a portion of an electrical interconnection between said first and second series transducers comprises said second shunt acoustic reflector.

18. An acoustic wave filter as claimed in claim 13, wherein said first and second series acoustic reflectors and said first and second shunt acoustic reflectors have substantially identical periodicities.

19. An acoustic wave filter having first and second electrical ports, said acoustic wave filter comprising:
a) a substrate for acoustic wave propagation;
b) a first series resonator disposed on said substrate and electrically coupled in series between said first electrical port and a first node, said first node coupled to said second electrical port, said first series resonator including at least a first series acoustic reflector and a first series transducer collectively disposed in an in-line configuration along a preferred axis of said substrate; and c) a first shunt resonator disposed on said substrate and electrically coupled in shunt between said first node and ground, said first shunt resonator including at least a first shunt acoustic reflector and a first shunt transducer collectively disposed in an in-line configuration along a preferred axis of said substrate, wherein said first shunt transducer and said first series transducer have different periodicities not equal to periodicities of said first series acoustic reflectors and said first shunt acoustic reflectors.

20. An acoustic wave filter as claimed in claim 19, said acoustic wave filter further comprising:

d) a second series resonator disposed on said substrate and electrically coupled in series between said first node and a second node, said second node coupled to said second electrical port, said second series resonator including at least a second series acoustic reflector and a second series transducer collectively disposed in an in-line configuration along a preferred axis of said substrate; and e) a second shunt resonator disposed on said substrate and electrically coupled in shunt between said second node and ground, said second shunt resonator including at least a second shunt transducer and a second shunt acoustic reflector disposed in an in-line configuration along a preferred axis of said substrate, wherein said second shunt transducer and said second series transducer have different periodicities not equal to periodicities of said first and second series acoustic reflectors and said first and second shunt acoustic reflectors.

21. An acoustic wave filter as claimed in claim 20, wherein a portion of an electrical interconnection between said first and second series transducers comprises said second shunt acoustic reflector.

22. An acoustic wave filter as claimed in claim 19, wherein said first and second shunt transducers are acoustically decoupled from each other.

23. An acoustic wave filter as claimed in claim 19, wherein said first and second series acoustic reflectors and said first and second shunt acoustic reflectors have substantially identical periodicity.

* * * * *